United States Patent
Germer et al.

(10) Patent No.: US 11,567,117 B2
(45) Date of Patent: Jan. 31, 2023

(54) METHOD AND SYSTEM FOR ACQUIRING A MEASUREMENT RELATED DATASET

(71) Applicant: Rohde & Schwarz GmbH & Co. KG, Munich (DE)

(72) Inventors: Annika Germer, Grafing (DE); Susanne Hirschmann, Dachau (DE); Jochen Pliquett, Glonn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 329 days.

(21) Appl. No.: 16/911,558

(22) Filed: Jun. 25, 2020

(65) Prior Publication Data

US 2021/0405109 A1  Dec. 30, 2021

(51) Int. Cl.
*G01R 31/28* (2006.01)
*G06N 5/04* (2006.01)
*G06N 20/00* (2019.01)

(52) U.S. Cl.
CPC ..... *G01R 31/2822* (2013.01); *G01R 31/2834* (2013.01); *G06N 5/04* (2013.01); *G06N 20/00* (2019.01)

(58) Field of Classification Search
CPC ............ G01R 31/2822; G01R 31/2834; G06N 20/00; G06N 5/04
See application file for complete search history.

(56) References Cited

U.S. PATENT DOCUMENTS

| | | | | |
|---|---|---|---|---|
| 10,393,711 B2 * | 8/2019 | Nettesheim | ............ | G01N 33/00 |
| 2014/0267296 A1 * | 9/2014 | Neeley | ..................... | G08B 5/00 345/440 |
| 2017/0336772 A1 * | 11/2017 | Plache | ............... | G05B 19/4183 |

FOREIGN PATENT DOCUMENTS

| | | | | |
|---|---|---|---|---|
| CN | 108427987 A | * | 8/2018 | ............ G06N 3/04 |
| CN | 109709557 A | * | 5/2019 | ............ G01S 13/95 |
| EP | 2 972 976 B1 | * | 5/2019 | ............ G06F 17/30 |
| EP | 2972976 B1 | | 5/2019 | |

* cited by examiner

*Primary Examiner* — Alvaro E Fortich
*Assistant Examiner* — Dilara Sultana
(74) *Attorney, Agent, or Firm* — Westman, Champlin & Koehler, P.A.

(57) ABSTRACT

The present invention relates to a data acquisition of measurement data together with further data specifying the operation during a measurement. For this purpose, I/Q measurement data are obtained and the steps for operating a measurement device during the measurement are monitored. A metadata package is generated, which includes the obtained I/Q measurement data along with the monitored steps of operating the measurement device.

18 Claims, 3 Drawing Sheets

```
metadata package
|
+---+- measurment data asset
|   +- auxiliary asset
|   +- sample asset
|       I (1,1), Q (1,1),..., I (1, j), Q (1, j)
|       ...
|       I (i, 1), Q (i, 1),..., I (i, j), Q (i, j)
|
+---+- device asset
|   |
|   +- initial / setup asset
|   |    configuration dev (1) ... dev (k)
|   |
|   +---+ operating asset
|   |   |
|   |   +- Operating Steps
|   |   |    step 1..n of dev (1)
|   |   |    ...
|   |   |    step 1..m of dev (k)
|   |
|   +-   DUT asset
|   |    DUT status/operation
```

Fig. 5

METHOD AND SYSTEM FOR ACQUIRING A MEASUREMENT RELATED DATASET

TECHNICAL FIELD

The present invention relates to a method and a system for acquiring a measurement related dataset. In particular, the present invention relates to an automated acquisition of measurement related data.

BACKGROUND

Although applicable in principle to any measurement system, the present invention and its underlying problem will be hereinafter described with a user support for a radio frequency measurement device.

The operation of modern measuring instruments is becoming more and more complex. Usually, a user may start a measurement and review the results after finishing the measurement. In some situations, a user may be not satisfied with the results. In this case, the user may ask an expert for further support in order to improve the operation of the measurement device and get better measurement results. For this purpose, the user may provide the expert with the measurement results and further information with regard to the configuration of the measurement procedure. In this connection, the user may manually specify the circumstances of the measurement procedure and the operational tasks, which are performed in order to obtain the measurement results.

However, manually specifying the circumstances how the measurement is performed may be a time-consuming and annoying task. Further to this, the user may not remember all operational steps, which are performed or make some failures in specifying the measurement procedure.

Against this background, a problem addressed by the present invention is how to obtain a precise dataset specifying a measurement task. A further problem addressed by the present invention is assisting a user by specifying a dataset related to a measurement task, in particular to perform an automated assembling of measurement related information.

SUMMARY

The present invention solves these problems by a method and a data acquisition system for automatically acquiring a measurement related dataset with the features of the independent claims. Further advantageous embodiments are subject-matter of the dependent claims.

According to a first aspect, a method for automatically acquiring a measurement related dataset is provided. The method comprises a step of obtaining measurement data, in particular I/Q measurement data. The obtaining of the measurement data may be performed by a measurement device. The method further comprises a step of monitoring the steps of operating the measurement device, in particular monitoring the steps, which result in the obtained I/Q measurement data. Further, the method comprises generating a metadata package. The generated metadata package includes the obtained I/Q measurement data along with the monitored steps of operating the measurement device.

According to a further aspect, a data acquisition system is provided. The data acquisition system may be an acquisition system for automatically acquiring a measurement related dataset. The system comprises a measurement device and a monitoring device. The measurement device is configured to obtain measurement data, in particular I/Q measurement data. The monitoring device is configured to monitor the steps of operating the measurement device. The monitoring device is further configured to generate a metadata package. A person of skill will recognize that the monitoring device may be part of the measurement device or separate from it. The metadata package includes the obtained I/Q measurement data along with the monitored steps of operating the measurement device.

The present invention is based on the finding that a retrospective analysis of a measurement operation requires not only the measurement data, but further measurement related information, in particular information with respect to the operational steps performed before and during the measurement procedure. However, manually collecting this measurement related information by a user is time-consuming task. Further, the user may not correctly remember all steps performed during the measurement operation, and thus, the provided information may be incomplete or faulty.

The present invention takes into account this finding and aims to provide an automated data acquisition of measurement related data. In particular, the present invention aims to provide an approach, which allows a machine-based data acquisition in order to provide a dataset with measurement related metadata specifying a measurement operation. It is for this purpose that not only the measurement data of a measurement procedure are acquired, but also the operational steps of operating the measurement device are also automatically monitored and recorded. These monitored operational steps are combined together with the related measurement data in order to generate a metadata package. Hence, the dataset of the metadata package comprises the obtained measurement data together with the information about the operational steps, which are applied to the measurement device in order to obtain the measurement data. In this way, the metadata package provides all required information in order to evaluate the measurement operation in a retrospective manner.

By providing a metadata package, which comprises the measurement data together with the related information how the measurement data are obtained, it is possible to track the operation of the measurement device at a later point in time. Accordingly, a further person, for example an expert, may analyze the data of the metadata package in a retrospective manner. Accordingly, the expert may provide suggestions to improve the measurement operation or make a proposal for subsequent measurement tasks. Accordingly, a measurement operation can be understand and analyzed at a later point in time and even at a different spatial position.

Since the monitoring of the operational steps, which are applied to the measurement device during the measurement operation are automatically monitored, there is no additional workload to the user during or after the measurement procedure in order to obtain the metadata package with the measurement results and the related additional information. Accordingly, the generation of the metadata package can be performed in a full automated manner without the need of additional user interaction during the measurement procedure. Thus, the operator of the measurement device can focus on the measurement operation.

By automatically monitoring the operation of the measurement device during the measurement procedure, it can be further ensured that no relevant information is lost, and thus, all relevant information are available for including these information into the metadata package.

The measurement device may be any kind of measurement device, for example, a signal analyzer, which may perform a vector signal analysis. In particular, the measurement device may be a measurement device, which acquires a modulated signal, in particular a modulated radio frequency signal. Especially, the measurement device may acquire an In-phase (I) component and a quadrature (Q) component of a measure signal, separately. However, any other appropriate measurement device may be possible, too.

The measurement data, which are obtained by the measurement device may relate to one or more signals, which are received by the measurement device from a number of one or more devices under test. The device under test may be, for example, a communication device such as a radio, a mobile phone, a base station or the like. However, it is understood, that any other kind of device under test may be tested by the measurement device, too.

Furthermore, the measurement device may additionally or alternatively measure any other kind of signal. For example, the measurement device may measure one or more signals, which are provided to a device under test by a wired or wireless connection. Especially, it may be possible that the measurement device may measure test signals provided to a device under test together with one or more signals obtained from the device under test.

The measurement device may measure the respective one or more signals and generate measurement data related to the measured signals. For this purpose, the measurement device may comprise appropriate components such as amplifiers, attenuators, analogue-to-digital converters, filters etc.

The measurement data may be stored in an internal memory. Further, the measurement data may be processed in any appropriate manner. The obtained measurement data may be provided to a user on a display. Additionally or alternatively, the measurement data may be forwarded to a further device by a wired or wireless communication link.

In order to perform a measurement by the measurement device, the measurement device has to be configured and operated by a user. For this purpose, the user has to perform a number of operating steps. For example, the user may apply a number of settings by operating input elements of the measurement device. For instance, a user may adapt an amplification or attenuation by rotating a related knob, select a specific operating mode by pressing a respective bottom, or the user may perform any other operation for configuring the measurement device. Further, the user may select and load predetermined configuration. In this case, the user may further apply one or more modifications to the predetermined configuration. It may be also possible that the user may load a specific configuration file or the like.

Besides a direct configuration of the measurement device, it may be also possible to configure the measurement device remotely. For example, the measurement device may be controlled by means of Standard Commands for Programmable Instruments (SCPI) via an appropriate interface remotely. It may be even possible to combine SCPI commands and manual steps for configuring the measurement device.

When starting a measurement operation, all steps for configuring the measurement device may be monitored, for example, by a monitoring device. For this purpose, the monitoring device may record all operational steps, which are applied to the measurement device. In particular, all manual operations of a user are recorded. Further, remote commands such as SCPI commands, which may be received from further devices, may be also recorded. In this way, the monitoring device may record a sequence of all operations, which are applied to the measurement device during a measurement operation. In this way, the operation and configuration of the measurement device can be traced at a later point in time by analyzing these recorded data. The monitoring device may be part of the measurement device or separate from it.

When a specific measurement operation has been completed, or upon request of a user, the monitoring device may generate a dataset of a measurement operation, which comprises a metadata package with the obtained measurement data together with the monitored steps, which are applied to the measurement device during the measurement. This metadata package comprises the measurement data together with the information how the measurement device is operated before and during the measurement procedure. By analyzing this metadata package, it is possible to understand the measurement procedure and the result of this measurement operation.

The monitoring device may comprise hardware elements like e.g. a processing unit. However, the monitoring device may be also software-implemented. For this purpose, instructions may be stored in a memory that is coupled to a general purpose processor, for example, via a memory bus. The processor may execute an operating system that loads and executes the instructions. The processor may be, for example, an Intel processor that runs a Windows or Linux operating system that loads and executes the instructions. Alternatively, the processor may be a processor of a device that runs an embedded operating system for loading and executing the instructions.

The generated metadata package may be locally stored in a memory, for example an internal memory of the monitoring device. However, any other memory may be also possible. For example, the metadata package may be stored on an external memory device such as a USB stick, a secure data (SD) card or any other appropriate external memory device.

Additionally or alternatively, it may be also possible to transfer the generated metadata package to a further device via a wired or wireless communication link. For this purpose, the monitoring device may comprise an appropriate interface for transmitting the generated metadata package data via the respective communication link. Such a communication link may be, for example, a network connection such as an Ethernet connection or a WiFi connection. However, any other kind of communication link such as a mobile radio communication may be possible, too. In particular, the communication may be established via a secure/encrypted communication link.

For example, the data of the metadata package may be uploaded to a remote server such as a cloud or the like along with or separate from the measurement data asset. Accordingly, the uploaded metadata package are available for a further analysis as will be described in more detail below.

The metadata package may be provided in any appropriate data format. For example, the measurement data and the related data of the steps of operating is a measurement device may be stored together in a data file. For example, the data may be stored in a XML format or the like. However, it may be also possible to use, for example, a standard data format for providing the measurement data and provide the related data of the steps for operating as a measurement device in a separate, associated data file.

Further embodiments of the present invention are subject of the further sub-claims and of the following description, referring to the drawings.

In a possible embodiment, the monitoring device is configured to obtain Standard Commands for Programmable Instruments (SCPI) commands. In particular, the monitoring device may obtain SCPI commands provided by the measurement device. The obtained SCPI commands may be included into the metadata package. SCPI commands may be used, for example for remotely configuring and/or operating devices such as the measurement device. By monitoring and recording the received SCPI commands, the way of configuring and/or operating the measurement device can be recorded. In this way, the operational procedure of the measurement device is recorded even when the measurement device is remotely controlled.

In a possible embodiment, the measurement device may be a measurement device in a measurement arrangement with multiple devices. In this case, the monitoring device may be configured to record SCPI commands provided to the multiple devices. Accordingly, the monitoring device may not only monitor and record the SCPI commands of the measuring device, but also further commands to other devices of the measurement arrangement. In this way, the configuration and operation of the multiple devices may be analyzed and reconstructed based on the recorded SCPI commands.

In a possible embodiment, the measurement device is configured to obtain the I/Q measurement data by measuring a device under test (DUT). The monitoring device is configured to obtain DUT related data. Further, the monitoring device may be configured to generate the metadata package by including the DUT related data to the metadata package. In this way, the metadata package comprises not only the measurement data and the operating steps for configuring the measurement device, but also additional information in conjunction with the device under test, i.e. the signal source, which is measured. Accordingly, when analyzing the data of the metadata package, it will be also possible to reconstruct the operating mode and/or configuration of the device under test.

In a possible embodiment, the metadata package comprises at least the data relating to the steps of operating the measurement device in a machine readable form. For example, the information relating the configuration/operation of the measurement device may be specified by a particular encoding. For this purpose, it may be possible to specify each operational step, which is performed at the measurement device by a related code number or the like. However, it is understood, that any other manner for specifying the information in a machine readable form may be possible, too. In this way, the information in the metadata package, which relates to the operational steps performed at the measurement device, may be easily analyzed and processed by a further device such as a computer or the like.

In a possible embodiment, at least the steps of operating the measurement device in the metadata package are specified in a human readable form. For example, the information may be specified in form of text elements or the like. For this purpose, a XML format or the like may be used. However, any other kind of specifying the respective information in a human readable form may be possible, too. By providing the respective data in a human readable form, it may be possible to check the respective information. In this way, a user may easily goes through the respective information in order to determine, whether or not the information comprise confidential information or any other kind of information, which should be not shared with a third party. For this purpose, the metadata package may be provided to a user. The user may check the provided metadata package and determine whether or not the respective metadata package may be provided to a third party, for example an external expert or a processing device.

In a possible embodiment, the monitoring device is configured to determine a setting of the measurement device. In particular, the setting of the measurement device at the time when the measurement data are measured may be determined. The determined setting of the measurement device may be included in the metadata package. In this way, not only the operational steps during the measurement procedure are available in a metadata package, but also the detailed setting/configuration of the measurement device can be shared and evaluated by the metadata package. The data relating to the setting of the measurement device may comprise, for example, a specification of the applied measurement mode, data relating to a time basis, a sampling rate, amplification, attenuation, applied (pre)processing algorithm or any other kind of setting of the measurement device. The monitoring device may be part of the measurement device or separate from it.

In a possible embodiment, the monitoring device is configured to label the obtained measurement data. In particular, the measurement data may be labelled based on the monitored steps of operating the measurement device. For this purpose, it may be possible to specify a number of predetermined labels, and to assign one of these predetermined labels to the obtained measurement data. However, it may be also possible to separate the measurement data into multiple segments and to assign an individual label to each segment of the measurement data. Furthermore, it may be also possible to assign multiple labels to the measurement data or each segment of the measurement data. The labels may specify, for example, specific operations of a user, specific settings or modes of the measurement device or any other appropriate associated with the measurement procedure for acquiring the respective measurement data. By labelling the measurement data, it is possible to automatically analyze the measurement data and associate specific properties according to the respective labels. In this way, the processing of the measurement data, in particular an automatic processing of the measurement data can be further improved.

In a possible embodiment, the data acquisition system may comprise a processing device. The processing device may receive the metadata package, in particular the metadata package with the labelled measurement data. Accordingly, a machine-learning algorithm may be trained based on the labelled measurement data. The machine-learning algorithm may relate, for example, to an algorithm for analyzing/evaluating the measurement device or the data in the metadata package, e.g. the machine-learning algorithm, which may automatically generate an analysis of the measurement operation. This analysis may provide, for example, recommendations or suggestions in order to further improve the measurement operation. Accordingly, by using the data of the metadata package, in particular the labelled measurement data, the algorithm may be further trained in order to improve the performance of the algorithm.

In a possible embodiment, the acquisition system may comprise an evaluation device. The evaluation device may be configured to analyze the monitored steps of operating the measurement device. The analyzing device may further reconstruct a user behavior of the user, which operates the measurement device. In particular, the evaluation device may read and analyze the metadata package for analyzing the user behavior. Accordingly, the user behavior may be analyzed in order to generate suggestions or recommendations for a user in order to further improve the operation of the measurement device. Accordingly, the measurement results can be improved by guiding or teaching the user according to the recommendations provided by the evaluation device. The evaluation device may use the generated metadata package in real time in order to further guide the user through the measurement procedure. However, it may be also possible to use the metadata package in an offline mode in order to analyze the user behavior at a later point in time after the measurement procedure has been completed. In particular, it may be possible to collect multiple metadata packages in order to evaluate the behavior of multiple users. In this way, systematical problems of users during the operation of a measurement device may be identified in an automated manner. In this way, further development of measurement device can be improved or recommendations can be generated in order to help users operating the respective measurement devices.

With the present invention it is possible to automatically collect not only measurement data of a measurement procedure, but also additional measurement related data, in particular data related with an operation of a measurement device. In particular, the steps of operating the measurement device during a measurement procedure may be monitored and recorded and a metadata package may be generated, which comprises the measurement data together with the respective operational steps. Since this acquisition of the operational steps and the generation of the metadata package with the measurement data and the operational steps is performed in an automated manner, a reliable data source for further evaluation is generated.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures and the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

Figure 1:
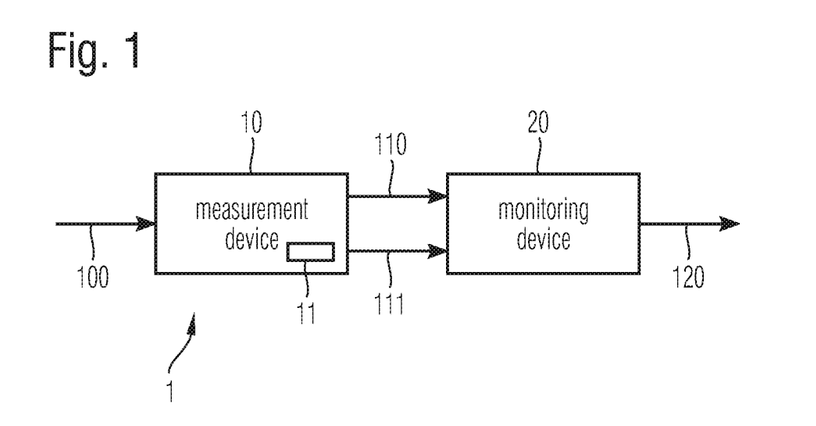
FIG. 1: shows a schematic block diagram of a data acquisition system according to an embodiment.

FIG. 1 shows a block diagram of a data acquisition system 1 according to an embodiment. The data acquisition system in FIG. 1 comprises a measurement device 10 and a monitoring device 20. Measurement device 10 measure one or more signals 100 and provide measurement data 110 according to the measured signals 100. For example, measurement device 10 may comprise elements such as filters, amplifiers, attenuators, analogue-to-digital converters etc. for generating the measurement data 110. Measurement data 10 may be stored in an internal memory of measurement device 10. Further, the measurement data 110 may be provided to a user, for example by means of a display or the like. It may be also possible that measurement device 10 performs any kind of processing before providing the measurement data 10.

The operation of measurement device 10 may be controlled, for example, by a user. For this purpose, measurement device 10 may comprise an input interface 11 for receiving any kind of input in order to configure or operate measurement device 10. For example, input interface 11 may comprise elements such as buttons, knobs or the like. Accordingly, the user may configure the measurement device 10 by pressing a specific button or rotating a knob. Furthermore, input interface 11 may comprise a touch display for receiving user input. However, any other elements for receiving user input may be possible, too.

Further to this, user interface 11 may comprise an interface for communicatively coupling the measurement device 10 with a further device, for example, a remote computer. Accordingly, measurement device 10 may receive commands for configuring or operating the measurement device 10 from this remote device. In particular, Standard Commands for Programmable Instruments (SCPI) may be used for configuring and/or operating measurement device 10.

Accordingly, measurement device 10 may be configured and operated based on the user input directly provided via user interface 11 or received from a remote device, for example by SCPI commands.

Data acquisition system 1 further comprises a monitoring device 20. Monitoring device 20 may receive the measurement data 110 provided by measurement device 10. For example, the received measurement data 110 may be stored in an internal memory of monitoring device 20. However, it may be also possible to use an external memory such as a USB stick, a secure data (SD) card or the like. In this case, monitoring device 20 may comprise an appropriate interface for connecting an external memory device to monitoring device 20.

Further to the recording of the measurement data 110, measurement device 20 also monitors and records the operational commands, which are applied to measurement device 10 before and/or during a measurement procedure. In particular, monitoring device 20 may record each step of operation for configuring or operating measurement device 10. Accordingly, each user input entered on the input interface 11 is monitored by monitoring device 20. Additionally or alternatively, monitoring device 20 may also monitor and record the SCPI commands provided to measurement device 10. For this monitoring, monitoring device 20 may be communicatively coupled with measurement device 10 in order to receive all user input and/or SCPI commands provided to measurement device 11.

Monitoring device 20 may further combine the obtained measurement data 110 and the monitored steps 111 of operating the measurement device 10. Accordingly, monitoring device 20 may generate a metadata package, which comprises the measurement data and the related steps of operating the measurement device 10. In particular, the metadata package may comprise the SCPI commands provided to measurement device 10. The metadata package may be provided as a common dataset 120. For example, this dataset 120 with the metadata package may be stored in an internal memory or an external memory device connected to monitoring device 20. Further, the dataset 120 may be forwarded to a remote device via a wired or wireless communication link. For this purpose, a wired or wireless communication interface may be provided in monitoring device 20. Accordingly, by providing the dataset 120 with the metadata package to a remote device, the remote device may receive, store and/or process the respective metadata package.

The measurement device 10 may be any kind of measurement device. For example, measurement device 10 may be a signal analyzer, which may performs a vector signal analysis application. In particular, measurement device 10 may measure one or more signals and provide separate data for an In-phase component (I) and a Quadrature component (Q). Accordingly, the measurement data 110 may comprise I/Q measurement data. However, it is understood, that any other kind of measurement device may be also possible.

Figure 2:
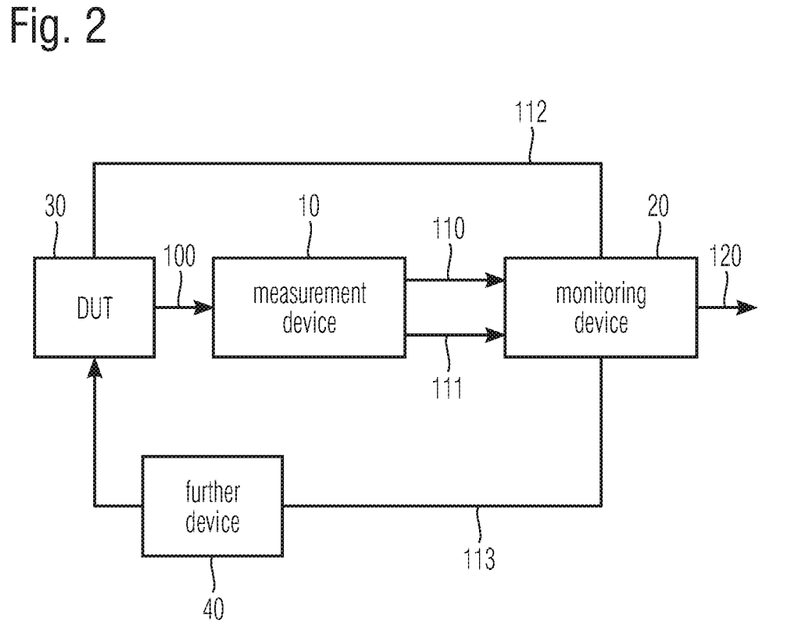
FIG. 2: shows a schematic block diagram of a data acquisition system according to a further embodiment.

FIG. 2 shows a schematic block diagram of a data acquisition system 1 according to a further embodiment. The embodiment according to FIG. 2 also comprises a measurement device 10 and a monitoring device 20. Thus, the explanation in connection with FIG. 1 also applies to the respective components in FIG. 2.

As can be further seen in FIG. 2, the test arrangement with the data acquisition system 1 may measure one or more signals of a device under test (DUT) 30. This device under test 30 may be any kind of device providing signals, which may be measured by measurement device 10. For example, device under test 30 may be a device emitting modulated radio frequency signals, for instance a radio, a mobile phone, a base station or the like. However, any other kind of device under test 30 may be possible, too.

In order to further obtain additional information, monitoring device 20 may acquire data 112, which are related with the device under test 30. For example, monitoring device 20 may receive information of a type or model of device under test 30. Further, it may be also possible that monitoring device 20 may receive data for specifying a configuration, a current setting or an operating mode of monitoring device 30. It may be also possible that device under test 30 is operated during the measurement, and the DUT related data 112 may relate to operating steps applied to the device under test 30. Accordingly, monitoring device 20 may also include this DUT related data 112 into the dataset 120 of the metadata package.

The test arrangement with the data acquisition system 1 may further comprise one or more additional devices 40. For example, such additional devices 40 may be additional test equipment such as a signal generator for providing specific signals to the DUT 30. The additional devices 40 may also comprise a communication partner, which establishes a wired or wireless communication link with the DUT 30. However, any other kind of additional device 40 in conjunction with a desired test arrangement may be also possible.

In such a configuration, monitoring device 20 may also receive further data 113 from the one or more additional devices 40. For example, the data 113 of the additional devices 40 may specify a type or model of the respective devices 40. Further, the data 113 may specify a current configuration or setting of the respective device 40, or the data 113 may relate to operations applied on the respective devices 40. In particular, it may be possible to remotely control the respective devices 40 by SCPI commands. In this case, monitoring device 20 may also monitor and record the respective data 113, in particular the SCPI commands applied to the further devices 40. The additional data 113 related to the further devices 40 may also be included in the dataset 120 of the metadata package.

The data in the metadata package, in particular the data related to the steps applied to the measurement device 10 or the further devices 30, 40 may be specified in a machine readable form. In particular, the SCPI commands may be specified in an appropriate machine readable form. For example, each command or operation applied to one of the devices, in particular the measurement device 10, may be specified by a specified code, for example a number or the like. However, any other manner for specifying the operational steps or command provided to the respective devices may be possible, too. Accordingly, the machine readable information may be easily used by further processing devices in order to analyze the information in the metadata package.

Additionally or alternatively, it may be also possible to specify the information in the metadata package in a form, which can be read by a human. For example, each operational step or SCPI command may be represented by a clear text, which can be read by a human. For example, a XML format may be used. However, any other format, which can be read by a human may be also possible. Accordingly, a user may analyze the metadata package and determine whether or not the metadata package comprises confidential data, which shall be not shared with a third party. For example, the human readable data may be provided to a user before transmitting the dataset 120 to a further device, and the user may determine whether or not is allowable to forward the dataset 120.

The data of the metadata package may be stored, for example, by a data file. For this purpose, any appropriate file format may be used. The data of the metadata package may be provided by simply combining the measurement data and the additional data specifying the steps of operating the measurement device, and if available the further devices 30, 40. However, it may be also possible to apply a data compression before distributing the dataset of the metadata package.

Furthermore, it may be also possible to encrypt the dataset 120 of the metadata package at least in part. For example, it may be possible that at least the data relating to the operational steps, in particular the SCPI commands may be encrypted. However, it may be also possible to completely encrypt the whole dataset 120 with the metadata package. For this purpose, any appropriate encryption scheme may be applied to the dataset 120. Furthermore, it may be also possible to use a secured/encrypted data channel for transmitting the dataset 120 from the monitoring device 20 to a further, remote device.

Figure 3:
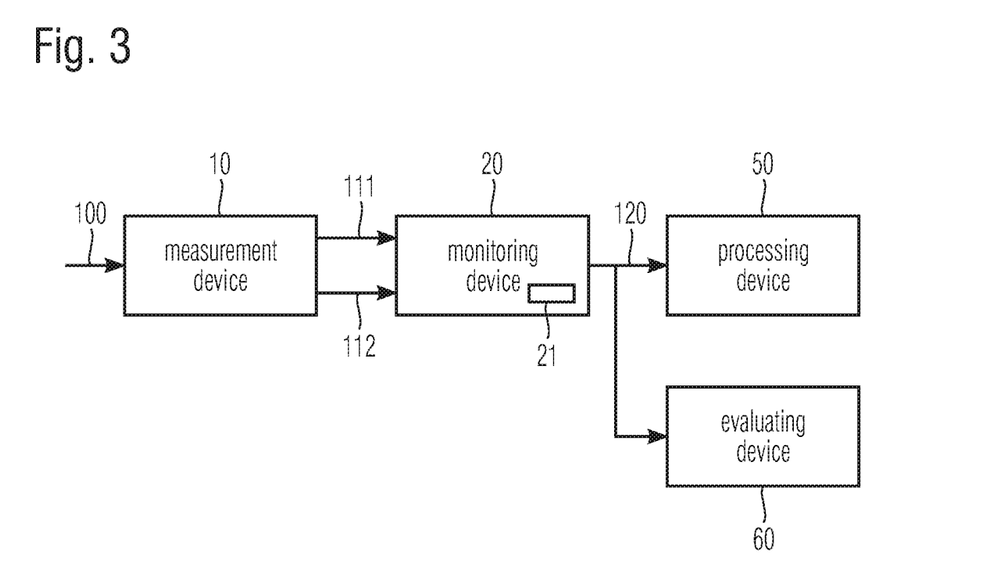
FIG. 3: shows a schematic block diagram of a data acquisition system according to still a further embodiment.

FIG. 3 shows a schematic block diagram of a data acquisition system 1 according to still a further embodiment. This data acquisition system 1 may comprise components as already described above in connection with FIG. 1 or 2. Thus, all explanations in connection with these figures also apply to the data acquisition system 1 according to FIG. 3.

The monitoring device 20 may further comprise, for example, a labelling device 21. Accordingly, monitoring device 20, in particular labelling device 21 may refer to the additional data, in particular the data relating to the steps of operating the measurement device 10 and/or the further devices 40, 30 and/or the respective SCPI commands. Based on this information, the obtained measurement data 110 may be labelled accordingly. For example, based on the additional data 111, a specific operational behavior, a specific configuration of the measurement device 10 or any other specific characteristics may be identified and a respective labelling may be applied to the measurement data. For this purpose, one or more labels may be assigned to the measurement data 110 as a whole. However, it may be also possible to segment the measurement data 110 into multiple measurement data segments and to assign individual labels to each segment of the measurement data 110. For example, a specific label may be assigned to a corresponding position of the measurement data 110 where a user has performed a respective operation on the measurement device 10 and/or a respective SCPI command has been received. However, any other manner for labelling the measurement data 110 may be possible, too.

The labelled measurement data may be provided by the dataset 120 comprising the metadata package.

The metadata package may be analyzed and evaluated by a processing device 50. For example, processing device 50 may be a device, which analyzes the dataset 120 with the metadata package in order to reconstruct the operation of the measurement device 110 when acquiring the respective measurement data. Accordingly, an expert may analyze this situation based on the reconstructed configuration. Thus, the expert may identify failures or problems during the operation by the user and thus, the expert may provide suggestions or recommendations to the user in order to improve the measurement procedure. Hence, by automatically generating the dataset 110 with the metadata package and further by the automated reconstruction of the measurement situation at the processing device 50, the reconstruction of the related measurement situation can be significantly improved.

However, it may be even possible to use specific algorithm in order to automatically reconstruct the measurement situation and further automatically identify recommendations for improving the operation of the measurement device 10 during the measurement procedure. In particular, machine-learning algorithm may be used for analyzing the measurement situation, which is reconstructed based on the dataset 120 of the metadata package.

Accordingly, the machine-learning algorithm may be also trained based on the dataset 120 of the metadata package. In particular, the labelled measurement data of the dataset 120 may be used for draining the machine-learning algorithm. However, it is understood, that the labelled measurement data may be also used for training any other kind of machine-learning algorithm.

In order to obtain an appropriate database for the machine-learning algorithm, it may be possible to use a specific data server, for example a cloud, which may store a huge number of datasets 120 with metadata packages. In this way, an appropriate database for training machine-learning algorithm can be provided.

Additionally or alternatively, it may be also possible that the data acquisition system 1 comprises an evaluating device 60. This evaluating device 60 may analyze the monitored steps 111 of operating the measurement device 10. The evaluating device 60 may further reconstruct a user behavior of a user, which operates the measurement device 10. In particular, the reconstruction may be based on the data of the dataset 120 comprising the metadata package. Based on the reconstructed user behavior, the evaluating device may identify failures in operating the measurement device 10. Additionally or alternatively, the evaluating device may also analyze the user behavior in order to automatically provide recommendations or suggestions of operating the measurement device 10. In this way, the user based operation of the measurement device 10 can be improved. In particular, the evaluation of the user behavior can be performed in real time based on the currently provided dataset 110 with the metadata package. However, it may be also possible that the evaluation device 60 analyses the user behavior at a later point in time based on stored metadata packages. It will be understood that the evaluating device, monitoring device, processing device, and measurement device may be incorporated as parts of one another or be separate in any permutation.

Figure 4:
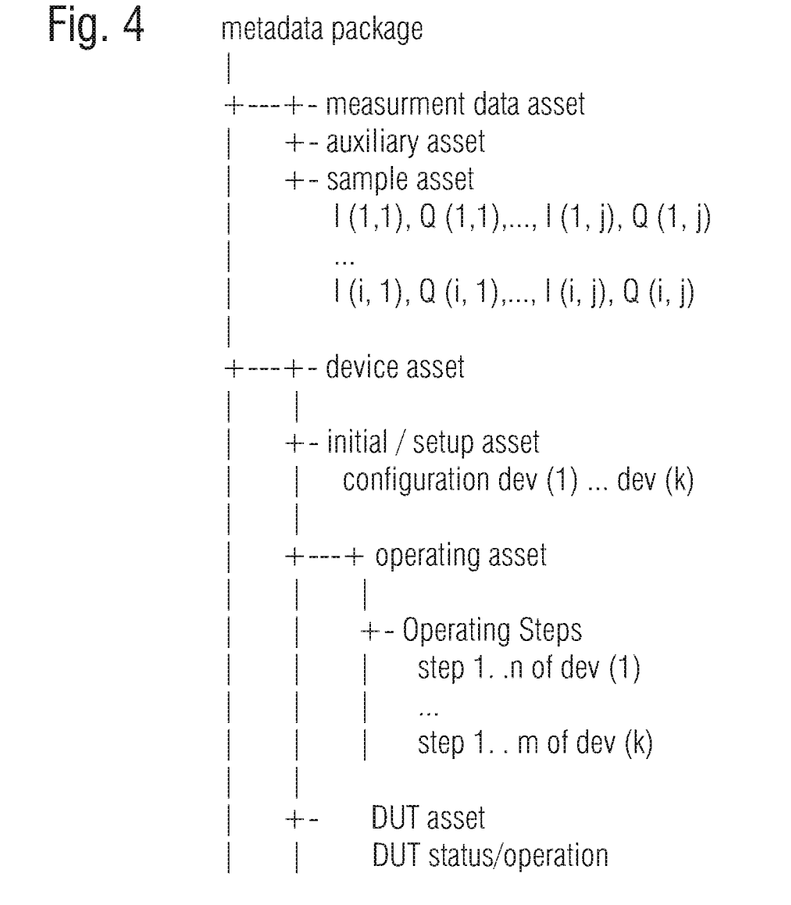
FIG. 4: shows a schematic diagram of a metadata package provided by a data acquisition system according to an embodiment.

FIG. 4 shows an example of a schematic representation of a metadata package according to an embodiment. The metadata package in this example comprises at least a measurement data asset and a device asset. In the measurement data asset, I/Q measurement data for a number of measurement channels may be provided. In this example, the measurement arrangement may provide I/Q measurement data for a number of j data channels. Accordingly, a data element $I(r,s)$ may relate to the r-th In-Phase data of measurement channel r, and $Q(r,s)$ may relate to the corresponding Quadrature measurement data sample. Furthermore, additional data for characterizing I/Q measurement data may be provided. For example, the additional data in the auxiliary asset may comprise data for specifying a data range, resolution, sampling rate or any other samples related information.

The metadata package may further comprise a device asset. The operation asset may comprise information relating to the configuration/operation of the measurement device 10 before and during the data acquisition. For example, the device asset may comprise an initial/setup asset. In this initial/setup asset the initial configuration of the measurement device 10 may be specified. If a number of more than one measurement devices 10 are used in the measurement process, a separate asset may be provided for each measurement device 10.

The device asset may further comprise an operating asset. In this operating asset, the step for operating the respective measurement device 10 may be provided. For example, each operation of the user may be recorded and provided in the operating asset. In case that multiple measurement device 10 are used, a separate operating asset may be provided for each measurement device 10. The operating steps may relate to steps which are manually applied by a user. The operating steps may also relate to SCPI commands which are provided for an automated/remote control of the respective measurement device 10.

Further, an additional DUT as it may be provided. This DUT asset may provide additional data with respect to the DUT. For example, a specific type of DUT may be characterized in the DUT asset, a (unique) identifier of the DUT may be provided, a specific configuration or status of the DUT may be specified, or steps for operating the DUT during or before the measurement may be also provided in the DUT asset. Similar to the operating asset, the step for operating the DUT may relate to manual operations of the user or SCPI commands provided for operating the DUT remotely.

Figure 5:
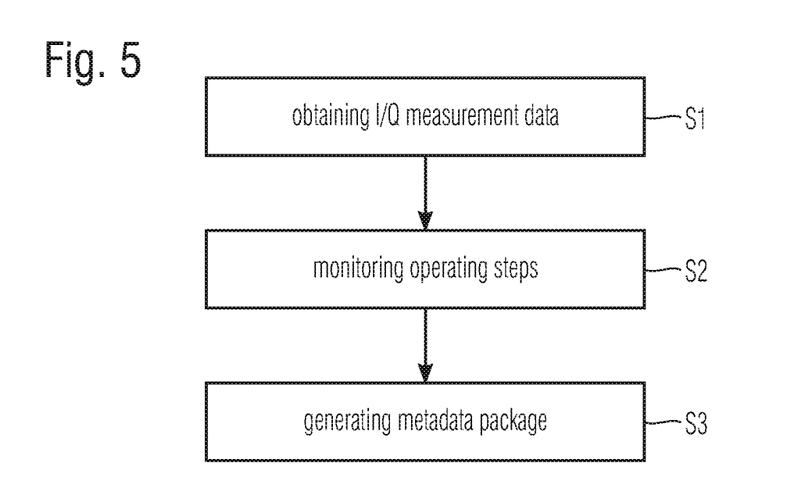
FIG. 5: shows a flow diagram of a method according to an embodiment.

FIG. 5 shows a flow diagram illustrating a method for automatically acquiring measurement related datasets. It is understood, that the method may comprise any kind of step for performing an operation as already described above in connection with the data acquisition system 1. Accordingly, the data acquisition system 1 may comprise any kind of component for performing an operation as will be described below in connection with the method.

In a step S1, measurement data, in particular I/Q measurement data may be obtained. The measurement data may be obtained by a measurement device 10. In step S2, the steps of operating the measurement device 10 may be monitored. In particular, the step S2 monitors the steps, which result in the obtained measurement data. In step S3, a metadata package is generated. The metadata package may include the obtained measurement data along with the monitored steps of operating the measurement device 10.

The monitored steps of operating the measurement device 10 may comprise recording SCPI commands, in particular SCPI commands provided to the measurement device 10. As already mentioned above, the measurement device 10 may be a measurement device in a measurement arrangement comprising multiple measurement devices. Accordingly, the recordings of the SCPI commands may comprise recording SCPI commands of the DUT 30 and/or at least one further device 40.

The measurement data, in particular I/Q measurement data, may relate to a measurement of a device under test 30. Accordingly, the generated metadata package may comprise including the DUT related data into the metadata package.

The monitored steps of operating the measurement device may be included in the metadata package in a machine readable form.

Additionally or alternatively, the monitored steps of operating the measurement device in the metadata package may be specified in a human readable form.

The metadata package may comprise settings of the measurement device 10 at a time when the measurement data are measured.

The method may further comprise a step of labelling the obtained measurement data, in particular the obtained I/Q measurement data based on the monitored steps of operating the measurement device 10.

Further, the method may comprise a step of training a machine-learning algorithm based on the labelled measurement data.

The method may comprise a step of analyzing the monitored steps of operating the measurement device 10. Further, the method may comprise reconstructing a user behavior of a user operating the measurement device 10.

Summarizing, the present invention relates to a data acquisition of measurement data together with further data specifying the operation during a measurement. For this purpose, I/Q measurement data are obtained and the steps for operating a measurement device during the measurement are monitored. A metadata package is generated, which includes the obtained I/Q measurement data along with the monitored steps of operating the measurement device.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon re-viewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not in-tended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF USED REFERENCE NUMBERS 1 data acquisition system
10 measurement device
11 input device
20 monitoring device
21 labelling device
30 device under test
40 further device
50 processing device
60 evaluation device
100 measurement signal
110 measurement data
111 operating step
112 DUT related data
113 data of further devices
120 dataset of metadata package

The invention claimed is:

1. A method for automatically acquiring a measurement related dataset during a measurement operation, the method comprising:
  obtaining I/Q measurement data by a measurement device;
  monitoring, by a monitoring device including a processing unit, steps of operating the measurement device, the monitoring device recording a sequence of all operational commands which are applied to the measurement device before and during the measurement operation and all manual operations of a user for configuring or operating the measurement device received as input by an input interface of the measurement device or from a remote computer; and
  generating a metadata package including the obtained I/Q measurement data along with the monitored steps of operating the measurement device such that the metadata package comprises the measurement data together with information how the measurement device is operated before and during the measurement operation; and analyzing and evaluating, by a processing unit, the generated metadata package in order to reconstruct the operation of the measurement device when acquiring the respective measurement data to identify failures or problems during the measurement operation; and analyzing the monitored steps for operating the measurement device and reconstructing a user behavior of a user operating the measurement device, and based on the re-constructed user behavior, identifying, by the evaluating device, failures in operating the measurement device, and analyzing, by the evaluating device, the user behavior in order to automatically provide recommendations or suggestions of operating the measurement device to improve the user based operation of the measurement device.

2. The method of claim 1, wherein monitoring of the steps of operating the measurement device comprises recording Standard Commands for Programmable Instruments, SCPI, commands provided to the measurement device.

3. The method of claim 2, wherein the measurement device is a measurement device in a measurement arrangement comprising multiple devices, and the recording SCPI commands comprises recording SCPI commands provided to the multiple devices.

4. The method of claim 1, wherein the I/Q measurement data relate to a measurement of a device under test, DUT, and the generating the metadata package comprises including DUT related data into the metadata package.

5. The method of claim 1, wherein the metadata package comprises the steps of operating the measurement device in a machine readable form.

6. The method of claim 5, wherein the metadata package comprises the steps of operating the measurement device the metadata package in a human readable form.

7. The method of claim 1, wherein the metadata package comprises settings of the measurement device at the time when the I/Q measurement data are measured.

8. The method of claim 1, comprising labeling the obtained I/Q measurement data based on the monitored steps of operating the measurement device.

9. The method of claim 8, comprising training a machine learning algorithm by the labeled I/Q measurement data.

10. A data acquisition system for automatically acquiring a measurement related dataset during a measurement operation, the system comprising a measurement device configured to obtain I/Q measurement data; and a monitoring device, including a processing unit configured to monitor steps of operating the measurement device, the monitoring device recording a sequence of all operational commands which are applied to the measurement device before and during the measurement operation and all manual operations of a user for configuring or operating the measurement device received as input by an input interface of the measurement device or from a remote computer, and to generate a metadata package including the obtained I/Q measurement data along with the monitored steps of operating the measurement device such that the metadata package comprises the measurement data together with information how the measurement device is operated before and during the measurement operation; and a processing unit for analyzing and evaluating the generated metadata package in order to re-construct the operation of the measurement device when acquiring the respective measurement data to identify failures or problems during the measurement operation; and an evaluating device for analyzing the monitored steps of operating the measurement device and reconstructing a user behavior of a user operating the measurement device;

the evaluating device, based on the re-constructed user behavior, identifying failures in operating the measurement device, and analyzing the user behavior in order to automatically provide recommendations or suggestions of operating the measurement device to improve the user based operation of the measurement device.

11. The data acquisition system of claim 10, wherein the monitoring device is configured to obtain Standard Commands for Programmable Instruments, SCPI, commands provided to the measurement device, and include the SCPI commands into the metadata package.

12. The data acquisition system of claim 11, wherein the measurement device is a measurement device in a measurement arrangement comprising multiple devices, and the monitoring device configured to record SCPI commands provided to the multiple devices.

13. The data acquisition system of claim 10, wherein measurement device is configured to obtain the I/Q measurement data by measuring a device under test, DUT, and the monitoring device is configured to obtain DUT related data and generate the metadata package by including the DUT related data into the metadata package.

14. The data acquisition system of claim 10, wherein the metadata package comprises the steps of operating the measurement device in a machine readable form.

15. The data acquisition system of claim 14, wherein the metadata package comprises the steps of operating the measurement device the metadata package in a human readable form.

16. The data acquisition system of claim 10, wherein the monitoring device is configured to determine a setting of the measurement device at the time when the I/Q measurement data are measured, and to include the determined setting of the measurement device in the metadata package.

17. The data acquisition system of claim 10, wherein the monitoring device is configured to label the obtained I/Q measurement data based on the monitored steps of operating the measurement device.

18. The data acquisition system of claim 17, comprising a processing device for receiving the metadata package and training a machine learning algorithm by the labeled I/Q measurement data.

* * * * *